US011219133B2

(12) United States Patent
Kuo et al.

(10) Patent No.: US 11,219,133 B2
(45) Date of Patent: Jan. 4, 2022

(54) DISPLAY MODULE

(71) Applicant: AU OPTRONICS CORPORATION, Hsin-Chu (TW)

(72) Inventors: Han-Ping Kuo, Hsin-Chu (TW); Jien-Feng Huang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/898,778

(22) Filed: Jun. 11, 2020

(65) Prior Publication Data

US 2020/0413550 A1 Dec. 31, 2020

Related U.S. Application Data

(60) Provisional application No. 62/868,072, filed on Jun. 28, 2019.

(30) Foreign Application Priority Data

Nov. 29, 2019 (TW) ................................ 108143699

(51) Int. Cl.
H05K 7/02 (2006.01)
H05K 7/04 (2006.01)
(Continued)

(52) U.S. Cl.
CPC ............. H05K 5/0017 (2013.01); H05K 5/03 (2013.01)

(58) Field of Classification Search
USPC ....................................................... 361/807
See application file for complete search history.

(56) References Cited

U.S. PATENT DOCUMENTS 7,755,895 B2 7/2010 Ikeda
9,111,841 B2 8/2015 Yamazaki et al.
(Continued)

FOREIGN PATENT DOCUMENTS

EP 3255482 12/2017
JP 2006294929 10/2006
(Continued)

OTHER PUBLICATIONS

TIPO has issued the office action for the corresponding Taiwan application dated Jul. 23, 2020.

Primary Examiner — Hung S. Bui
(74) Attorney, Agent, or Firm — WPAT, PC

(57) ABSTRACT

A display module including a cover plate, a first separating plate and a second separating plate, and a first display panel and a second display panel is provided. The cover plate is divided into a first block, a second block, and a connecting section between the first block and the second block. The first separating plate and the second separating plate are disposed on the cover plate respectively corresponding to the first block and the second block and are separated from each other. The first display panel and the second display panel are respectively disposed on a side of the first separating plate opposite to the cover plate and a side of the second separating plate opposite to the cover plate. In the display module, rigidity of the first separating plate and rigidity the second separating plate are respectively greater than rigidity of the cover plate, and the second block is rotatable relative to the first block based on the connecting section.

12 Claims, 9 Drawing Sheets

(51) Int. Cl.
    *H05K 5/00*        (2006.01)
    *H05K 5/03*        (2006.01)

(56) References Cited

U.S. PATENT DOCUMENTS

| | | | |
|---|---|---|---|
| 9,564,473 | B2 | 2/2017 | Yamazaki et al. |
| 9,780,160 | B2 | 10/2017 | Yamazaki et al. |
| 10,908,640 | B2 * | 2/2021 | Yamazaki ............ H02J 7/00302 |
| 2018/0095574 | A1 * | 4/2018 | Kim ...................... G06F 1/1677 |
| 2020/0271971 | A1 * | 8/2020 | Su ...................... G02F 1/133308 |

FOREIGN PATENT DOCUMENTS

| | | |
|---|---|---|
| TW | I309459 | 5/2009 |
| TW | 201843560 A | 12/2018 |

* cited by examiner

DISPLAY MODULE

TECHNICAL FIELD

The present invention relates to a display module. Specifically, the present invention relates to a display module having a separating plate disposed between a display panel and a cover plate.

RELATED ART

With the development of technologies, there are increasing places or situations in which a display module can be applied. For example, the display module may be disposed on a traffic vehicle to provide a driver and/or a passenger with required or expected information or images. However, when seats of the driver and/or the passenger are separated, ideal display angles relative to the driver and/or the passenger may be different. Therefore, the display module may need to be correspondingly adjusted according to riding statuses and viewing requirements of the driver and/or the passenger in the traffic vehicle to improve visibility, contrast, and brightness of a display screen. In this case, a display module with improved flexibility or bendability or a display module whose display angle may be adjusted in other manners may need to be further developed. Further, during switching or changing of the display angle of the display module, display quality is likely to deteriorate or units or components inside the display panel are likely to be damaged due to stress caused by factors such as warping or bending, etc. For example, during adjustment of the display angle of the display module, optical defects such as light leakage may be unexpectedly generated, or an original liquid crystal configuration of a display panel may be damaged. Therefore, a display module with a mechanism or a design suffering less from or free from stress impact is desired to improve performance and reliability of the display module in various application statuses.

SUMMARY

Technical Means for Resolving the Problem

In order to resolve the above problem, an embodiment of the present invention provides a display module, including: a cover plate, a first separating plate and a second separating plate, and a first display panel and a second display panel. The cover plate is divided into a first block, a second block, and a connecting section between the first block and the second block. The first separating plate and the second separating plate may be disposed on the cover plate respectively corresponding to the first block and the second block and are separated from each other. The first display panel and the second display panel are respectively disposed on a side of the first separating plate opposite to the cover plate and a side of the second separating plate opposite to the cover plate. Rigidity of the first separating plate and rigidity of the second separating plate are respectively greater than rigidity of the cover plate, and the second block is rotatable relative to the first block based on the connecting section.

Technical Effects Compared to the Prior Art

According to the display module provided in the embodiments of the present invention, possible problems existing when stress is directly transferred into the display panel during flexing or bending of the cover plate can be reduced or avoided. For example, the stress generated during flexing or bending of the cover plate may be blocked or absorbed by the disposed first separating plate and second separating plate with relatively large rigidity, thus reducing or eliminating impact of the stress on the display panel. Therefore, the display quality of the display module can be improved, and change or damage to configurations or components inside the display panel can be reduced or avoided.

DETAILED DESCRIPTION

Figure 1:
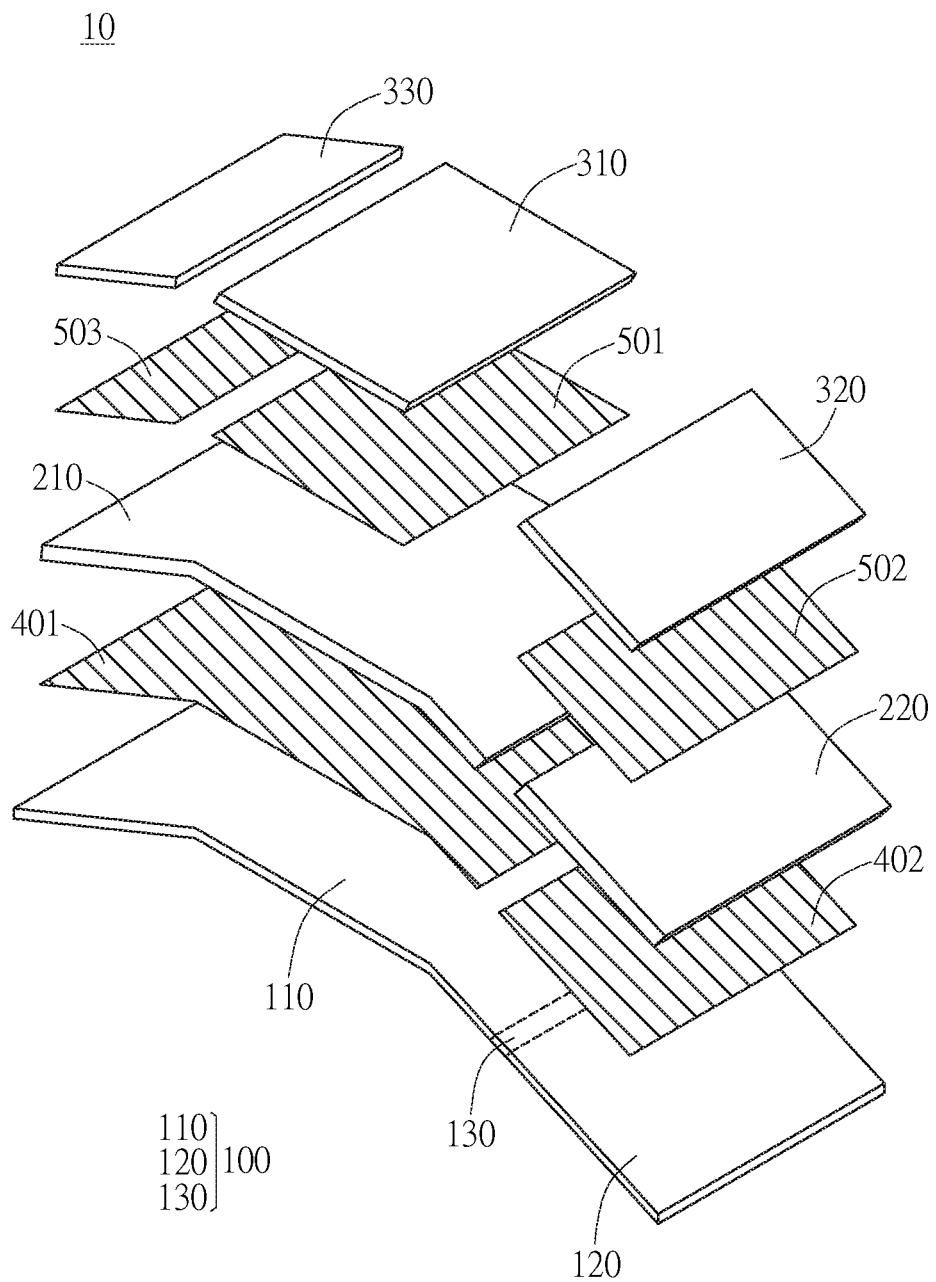
FIG. 1 is a schematic three-dimensional exploded view of a display module having a first separating plate and a second separating plate according to an embodiment of the present invention.

Various embodiments are described below, and a person of ordinary skill in the art may easily understand the spirit and principles of the present invention with reference to descriptions and the accompanying drawings. Although some specific embodiments are described in detail in this specification, such embodiments are merely exemplary and are not intended to be limitative or exhaustive in every respect. Therefore, various changes and modifications may be apparent and easily made to the present invention by a person of ordinary skill in the art without departing from the spirit and principles of the present invention.

In the accompanying drawings, the thicknesses of layers, films, panels, regions, and the like are enlarged for clarity. Throughout the specification, same reference numerals indicate same elements. It should be understood that when an element such as a layer, film, region or substrate is referred to as being "on" or "connected to" another element, it may be directly on or connected to the another element, or intervening elements may also be present. In contrast, when an element is referred to as being "directly on" or "directly connected to" another element, there are no intervening elements present. As used herein, "connection" may refer to a physical and/or electrical connection. Furthermore, "electrical connection" or "coupling" may mean that there are other elements between two elements.

It should be understood that although terms such as "first", "second", and "third" in this specification may be used for describing various elements, components, areas, layers, and/or parts, the elements, components, areas, layers, and/or parts are not limited by such terms. The terms are only used to distinguish one element, component, area, layer, or part from another element, component, area, layer, or part. Therefore, the "first element", "first component, "first area", "first layer", or "first part" described below may be otherwise referred to as a second element, component, area, layer, or part without departing from the teachings of the present invention.

The terms used herein are merely used for describing particular embodiments rather than limiting the present invention. As used in this specification, the articles "a", "an", and "the" are intended to include plural forms and include "at least one", unless the context clearly indicates otherwise. "Or" means "and/or". As used herein, the term "and/or" includes any and all combinations of one or more related items listed. It should also be understood that as used in this specification, the term "comprise" and/or "include" specifies the presence or addition of stated features, areas, wholes, steps, operations, elements, and/or components, but does not preclude the presence or addition of one or more other features, areas, wholes, steps, operations, elements, components, and/or combinations thereof.

Exemplary embodiments are described herein with reference to cross-sectional views used as schematic diagrams of idealized embodiments. Therefore, shape changes of drawings as a result of, for example, manufacturing techniques and/or tolerances may be expected. Therefore, the embodiments described herein should not be construed as being limited to specific shapes of regions shown herein, but include, for example, shape deviations caused by manufacturing. For example, a region shown or described as being flat may generally have rough and/or non-linear characteristics. In addition, an acute angle shown may be round. Therefore, the regions shown in the drawings are schematic in nature, and their shapes are not intended to show the precise shapes of the regions, and are not intended to limit the claims.

Figure 2:
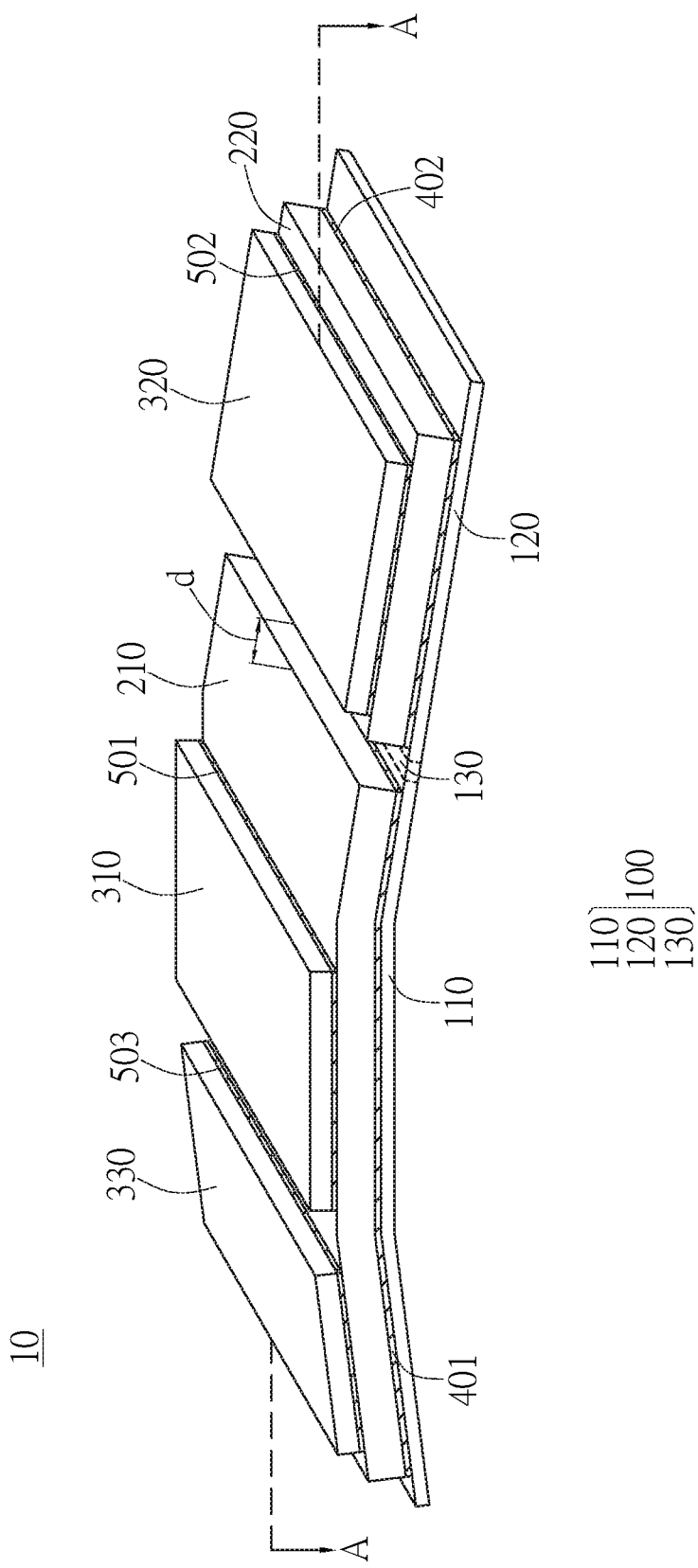
FIG. 2 is a schematic three-dimensional view of a display module having a first separating plate and a second separating plate according to an embodiment of the present invention.
Figure 3:
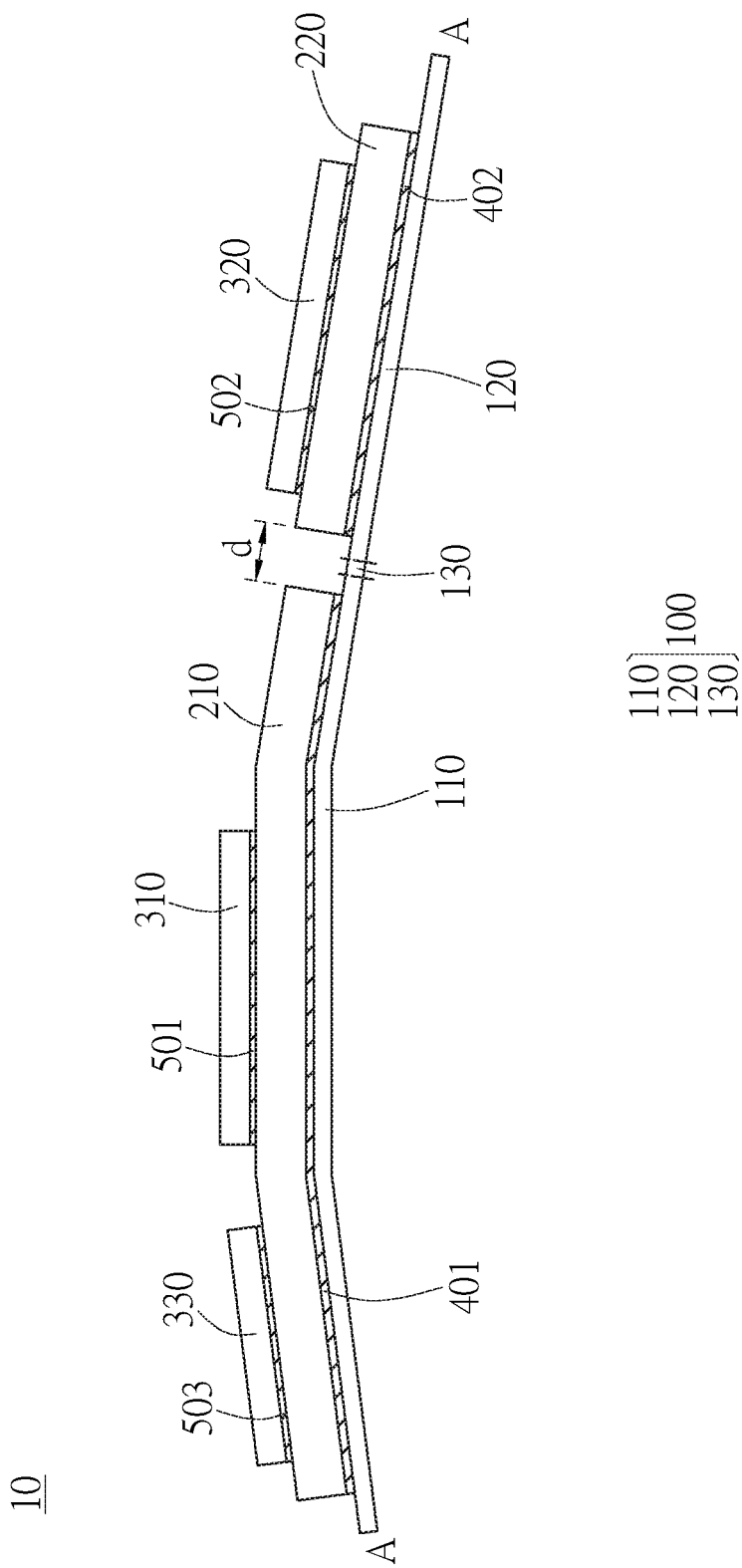
FIG. 3 is a schematic cross-sectional view of a display module taken along a section line A-A in FIG. 2 according to an embodiment of the present invention.

Referring to FIG. 1 to FIG. 3, according to an embodiment of the present invention, a display module 10 may include a cover plate 100, a first separating plate 210 and a second separating plate 220 disposed on the cover plate 100, and a first display panel 310 and a second display panel 320 respectively disposed on a side of the first separating plate 210 opposite to the cover plate 100 and a side of the second separating plate 220 opposite to the cover plate 100. In addition, according to this embodiment, the display module 10 further includes a third display panel 330 disposed on the first separating plate 210 together with the first display panel 310. In other words, the third display panel 330 may be disposed on a side of the first separating plate 210 opposite to the cover plate 100. However, in different embodiments, there may be no third display panel 330. In addition, according to other embodiments, the number of display panels that may be respectively disposed on the first separating plate 210 and the second separating plate 220 is not limited to the specific aspect shown herein.

The above integrally formed cover plate 100 may be divided into a first block 110, a second block 120, and a connecting section 130 between the first block 110 and the second block 120. Specifically, the first block 110, the second block 120, and the connecting section 130 are substantially different regions on the same integrally formed cover plate 100. The connecting section 130 is a main bending or flexing reference point for bending or flexing the cover plate 100 based on a preset mechanism or a preset method, and the first block 110 and the second block 120 are respectively different regions located at two ends of the connecting section 130 and separated by the connecting section 130. For example, the connecting section 130 may be a section preset to be connected to a rotating shaft or mechanism used for bending or flexing or a section serving as an axis for bending or flexing the cover plate 100. According to some embodiments, the connecting section 130 may be a region of the cover plate 100 having a flexibility range of more than half of a flexibility of the main bending or flexing reference point. In contrast, the first block 110 and the second block 120 may be two regions that are preset to be free from bending or flexure and whose dispose angles relative to each other may be changed. However, impacted by the bending or flexing action of the connecting section 130, the first block 110 and the second block 120 may also unexpectedly have a slight bending or deflection deviation. Therefore, the above is merely an ideal example, and the present invention is not limited thereto.

Accordingly, the first separating plate 210 and the second separating plate 220 may be disposed on the cover plate 100 respectively corresponding to the first block 110 and the second block 120 and are separated from each other. For example, the first separating plate 210 and the second separating plate 220 may be disposed on the cover plate 100 to be separated from each other by a gap d, and the first separating plate 210 and the second separating plate 220 may be respectively disposed on the first block 110 and the second block 120 of the cover plate 100. In some embodiments, the connecting section 130 of the cover plate 100 may be disposed corresponding to the gap d between the first separating plate 210 and the second separating plate 220. In addition, in some embodiments, a length of the connecting section 130 may be less than or equal to the gap d.

In some embodiments, the first display panel 310, the second display panel 320, and/or the third display panel 330 may be panels including any minimum unit (for example, a pixel) configured to perform displaying. In particular, the first display panel 310, the second display panel 320, and/or the third display panel 330 may be a liquid crystal display panel, an organic light emitting display panel, or an electroluminescent display panel, and have and are configured with pixels arranged for displaying. Accordingly, information or images may be displayed on the first display panel 310, the second display panel 320, and/or the third display panel 330 through the first separating plate 210 or the second separating plate 220 and the cover plate 100. Therefore, according to some embodiments, the first separating plate 210, the second separating plate 220, and/or the cover plate 100 may be made of a transparent material or a material having a specific transmittance. For example, the first separating plate 210 or the second separating plate 220 may be made of glass, polycarbonate (PC), or polymethyl methacrylate (PMMA), and the cover plate 100 may be made of glass or polyimide (PI). However, the above aspects of the first display panel 310, the second display panel 320, and/or the third display panel 330 and the materials of the first separating plate 210, the second separating plate 220, and/or the cover plate 100 are merely examples, and the present invention is not limited thereto.

Further, in some embodiments, as shown in FIG. 1 to FIG. 3, in order to dispose the components, adhesives may be disposed on interfaces between the components to bond or attach the components. For example, as shown in this embodiment, the display module 10 may further include adhesives 401, 402, 501, 502, and 503. In particular, the adhesive 401 may be disposed between the first block 110 of the cover plate 100 and the first separating plate 210 to attach the first block 110 and the first separating plate 210. The adhesive 402 may be disposed between the second block 120 of the cover plate 100 and the second separating plate 220 to attach the second block 120 and the second separating plate 220. The adhesive 501 may be disposed between the first display panel 310 and the first separating plate 210 to attach the first display panel 310 and the first separating plate 210. The adhesive 502 may be disposed between the second display panel 320 and the second separating plate 220 to attach the second display panel 320 and the second separating plate 220. The adhesive 503 may be disposed between the third display panel 330 and the first separating plate 210 to attach the third display panel 330 and the first separating plate 210.

According to some embodiments, the adhesives 401, 402, 501, 502, and 503 may be transparent optical glues or hydrogels, but the present invention is not limited thereto. In addition, according to other embodiments of the present invention, the interfaces between the components may be provided with other elements assisting in assembling the components instead of adhesives. Further, if the components can be attached by other means, no elements may be disposed on the interfaces between the components. Therefore, the above attachment adhesive is merely an example, and the present invention is not limited thereto.

Accordingly, the display module 10 described with reference to FIG. 1 to FIG. 3 may be substantially applied to various environments and situations for displaying. The second block 120 may rotate relative to the first block 110 based on the connecting section 130, so that a to-be-displayed block on the display module 10 may be adjusted according to viewing angles of different viewers. In other words, the cover plate 100 of the display module 10 may be substantially flexed or bent, so that dispose angles of the first block 110 and the second block 120 relative to each other may be changed, and a display orientation of each of the display panels (for example, the first display panel 310, the second display panel 320, and/or the third display panel 330) respectively disposed on the first block 110 and the second block 120 are also changed.

In this case, due to flexure or bending of the cover plate 100, stress may be generated from a flexing or bending reference point (for example, the connecting section 130), and the stress may be transferred along the cover plate 100 toward the display panels such as the first display panel 310, the second display panel 320, and/or the third display panel 330. Accordingly, the stress may adversely affect a display effect of the display panel and/or a structure of the display panel. However, according to this embodiment, since the first separating plate 210 and the second separating plate 220 are respectively disposed on the first block 110 and the second block 120 of the cover plate 100 and are separated from each other, when the first block 110 and the second block 120 rotate relative to each other to flex or bend the cover plate 100, the first separating plate 210 and the second separating plate 220 can resist flexure or bending transferred from the cover plate 100 through respective rigidity or structural strength. In this way, the stress from flexure or bending of the cover plate 100 may be at least partially absorbed or blocked by the first separating plate 210 disposed between the cover plate 100 and the first display panel 310 or the third display panel 330 and/or by the second separating plate 220 disposed between the cover plate 100 and the second display panel 320. Therefore, changes or damage to components or configurations inside each display panel or optical defects such as light leakage during displaying caused by directly transferring of the stress into each display panel such as the first display panel 310, the second display panel 320, and/or the third display panel 330 can be reduced or avoided.

According to some embodiments, flexibility of the cover plate 100 may be greater than flexibility of the first separating plate 210 and/or the second separating plate 220. Therefore, the cover plate 100 is more easily flexed or bent for adjustment according to different viewing angles. In addition, according to some embodiments, rigidity of the first separating plate 210 and/or the second separating plate 220 may be greater than rigidity of the cover plate 100 respectively. Therefore, the ability of the first separating plate 210 and/or the second separating plate 220 to absorb or block the stress can be further improved, so as to reduce or avoid a degree by which the stress is transferred into each display panel or reduce or avoid the phenomenon in which the stress is transferred into each display panel, thereby relieving the problem of damage of internal structures or deterioration of display quality for each display panel. For example, problems or defects caused by the flexing or bending action of the display module 10 during adjustment of the display module 10 according to different required or expected viewing angles can be reduced or avoided.

Accordingly, a rigidity difference between the first separating plate 210 and/or the second separating plate 220 and the cover plate 100 may be determined based on factors such as a required degree for flexing or bending the display module 10, reliability of each display panel, a distance between the connecting section 130 and each of the display panels, a relative ratio of the first block 110 to the second block 120, and a ratio of a length of the first block 110 or the second block 120 to a total length of the entire cover plate 100, etc. Accordingly, ratios and lengths shown in the drawings are merely exemplary, and the present invention is not limited thereto.

Figure 4:
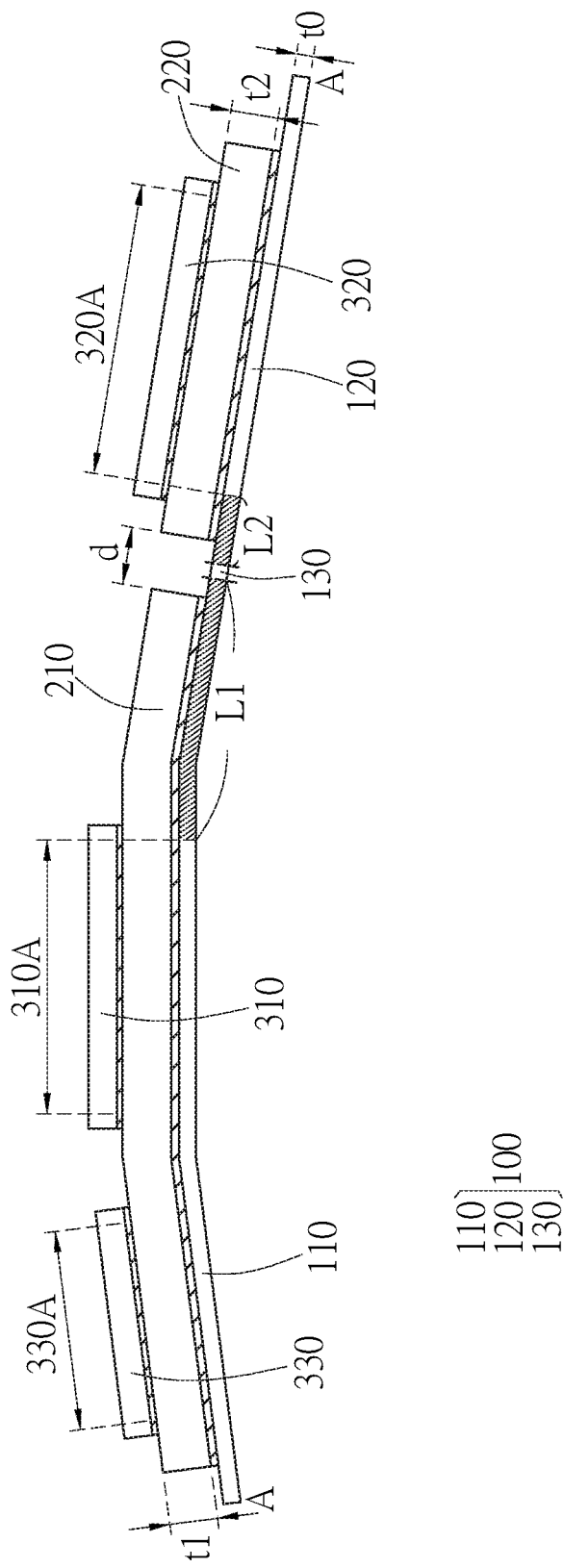
FIG. 4 is a schematic cross-sectional view of a display module having a first separating plate and a second separating plate according to another embodiment of the present invention.

Next, referring to FIG. 4, a display module 20 according to still another embodiment of the present invention is described. Descriptions of parts same as or similar to those of the display module 10 in FIG. 1 to FIG. 3 are omitted. Accordingly, the first display panel 310 of the display module 20 may have a first display region 310A for substantial displaying, the second display panel 320 may have a second display region 320A for substantial displaying, and the third display panel 330 may have a third display region 330A for substantial displaying. For example, the first display region 310A may be a region in the first display panel 310 configured with pixels for displaying or light emitting. The second display region 320A may be a region in the second display panel 320 configured with pixels for displaying or light emitting. The third display region 330A may be a region in the third display panel 330 configured with pixels for displaying or light emitting.

Figure 5:
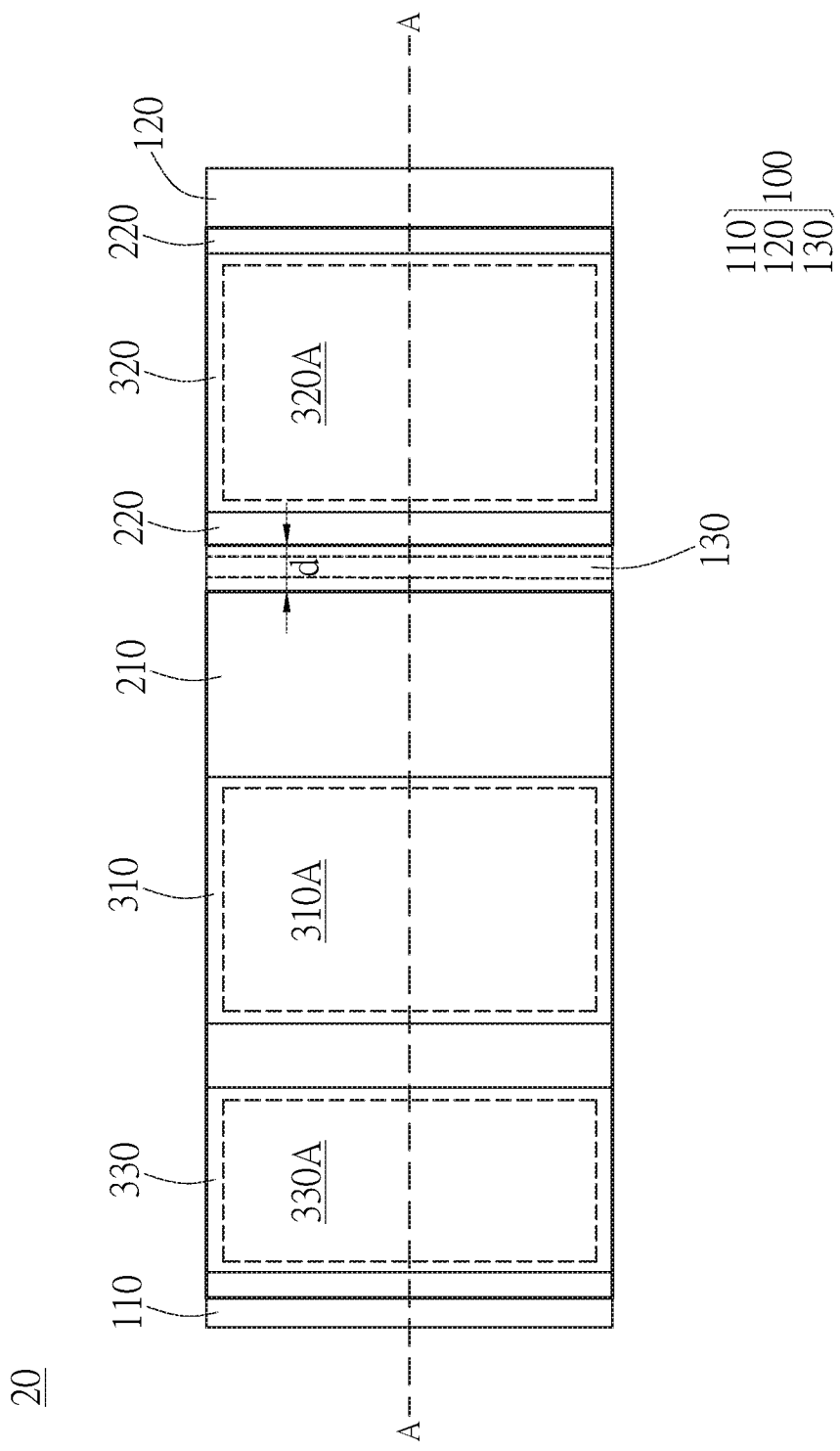
FIG. 5 is a schematic front view of a display module in FIG. 4 viewed from a side of a display panel opposite to a cover plate.

Accordingly, referring to both a cross-sectional schematic diagram of FIG. 4 and a front view of FIG. 5, in the display module 20, an area of the first separating plate 210 may be greater than an area of the first display region 310A of the first display panel 310. Preferably, the area of the first separating plate 210 may be greater than the area of the first display panel 310. Similarly, an area of the second separating plate 220 may be greater than an area of the second display region 320A of the second display panel 320. Preferably, the area of the second separating plate 220 may be greater than the area of the second display panel 320. In this embodiment, when the third display panel 330 is also disposed in the display module 20, the area of the first separating plate 210 may be greater than an area of the third display region 330A of the third display panel 330. Preferably, the area of the first separating plate 210 may be greater than the area of the third display panel 330. Accordingly, the first separating plate 210 may be disposed to at least span and overlap or cover the entire first display region 310A. The second separating plate 220 may be disposed to at least span and overlap or cover the entire second display region 320A. The first separating plate 210 may be disposed to at least span and overlap or cover the entire third display region 330A. Similarly, if there are more other display panels disposed relative to the first separating plate 210 or the second separating plate 220, the other display panels may also be disposed according to the same principle. In this way, at least the first display region 310A of the first display panel 310, the second display region 320A of the second display panel 320, and the third display region 330A of the third display panel 330 can be separated from the cover plate 100 by the first separating plate 210 and the second separating plate 220, thereby reducing or avoiding direct impact on the display regions used for displaying (such as the first display region 310A, the second display region 320A, and the third display region 330A) caused by the transferred stress from flexure or bending of the cover plate 100.

Further, according to this embodiment, in order to make bending or flexing smoother and reduce or avoid transferring of the stress into each component such as each display panel, the bending or flexing reference point is preferably away from the components by a distance greater than a preset distance. For example, according to an embodiment, the first block 110 may be fixedly disposed, and the second block 120 may rotate relative to the first block 110 based on the connecting section 130. For example, the entire display module 20 may be disposed in a cavity inside a system housing of a traffic vehicle, and the first block 110 may be fixed to the system housing, but the second block 120 may not be fixed to the system housing and may rotate relative to the first block 110 in the cavity. In this case, in order to reduce or avoid the impact of the stress on the first display region 310A of the closest first display panel 310 on the first block 110 that is fixed without being changed in a dispose angle, a shortest cover plate length L1 between the connecting section 130 and the first display region 310A may be preset such that the stress is unlikely to be transferred along the cover plate 100 into the first display region 310A of the first display panel 310.

For example, the shortest cover plate length L1 between the first display region 310A on the fixed first block 110 and the connecting section 130 may be greater than a shortest cover plate length L2 between the connecting section 130 and the second display region 320A on the second block 120 that is preset to be changed in a dispose angle. Accordingly, according to an embodiment, the shortest cover plate length L1 between the first display region 310A and the connecting section 130 may be greater than 10 mm. However, the above is merely an example. When materials of the components such as the cover plate 100, the first separating plate 210, and the second separating plate 220, and the display panels such as the first display panel 310, the second display panel 320, and the third display panel 330 are changed, the applicable shortest cover plate lengths L1 and L2 are not limited thereto.

In addition, according to another embodiment, in order to ensure that no interference is caused during bending or flexing of the cover plate 100, for example, the first separating plate 210 and the second separating plate 220 interfere with each other, a gap d between the first separating plate 210 and the second separating plate 220 is greater than 10 mm. For another example, in an embodiment, in order to ensure that there is sufficient space for bending or flexing the cover plate 100 based on the connecting section 130, a length of the connecting section 130 may be greater than 10 mm. However, the above is merely an example, and other embodiments of the present invention are not limited thereto in accordance with the principles of the present invention.

In addition, according to some embodiments, in order to make the rigidity of the first separating plate 210 and/or the rigidity of the second separating plate 220 greater than the rigidity of the cover plate 100, a thickness t1 of the first separating plate 210, a thickness t2 of the second separating plate 220, and a thickness t0 of the cover plate 100 may be correspondingly adjusted. For example, when the same material is used, the thickness t1 of the first separating plate 210 and/or the thickness t2 of the second separating plate 220 may be greater than the thickness t0 of the cover plate 100, so that the rigidity of the first separating plate 210 and/or the rigidity of the second separating plate 220 are/is greater than the rigidity of the cover plate 100. For example, the thickness t1 of the first separating plate 210 and/or the thickness t2 of the second separating plate 220 may be greater than 0.7 mm and less than or equal to 3 mm, and the thickness t0 of the cover plate 100 may be greater than 0.3 mm and less than or equal to 0.7 mm. However, the above is merely an example, and the present invention is not limited thereto. In addition, when the first separating plate 210 and/or the second separating plate 220 are/is made of a material different from that of the cover plate 100, the thickness t1 of the first separating plate 210 and/or the thickness t2 of the second separating plate 220 may also be equal to or less than the thickness t0 of the cover plate 100. The present invention is not limited to the specific aspect shown in the text or drawings.

Next, a display module 30 according to still another embodiment of the present invention is further described with reference to FIG. 6 to FIG. 9. Descriptions of parts same as or similar to those of the above display module 10 or 20 are omitted.

Figure 6:
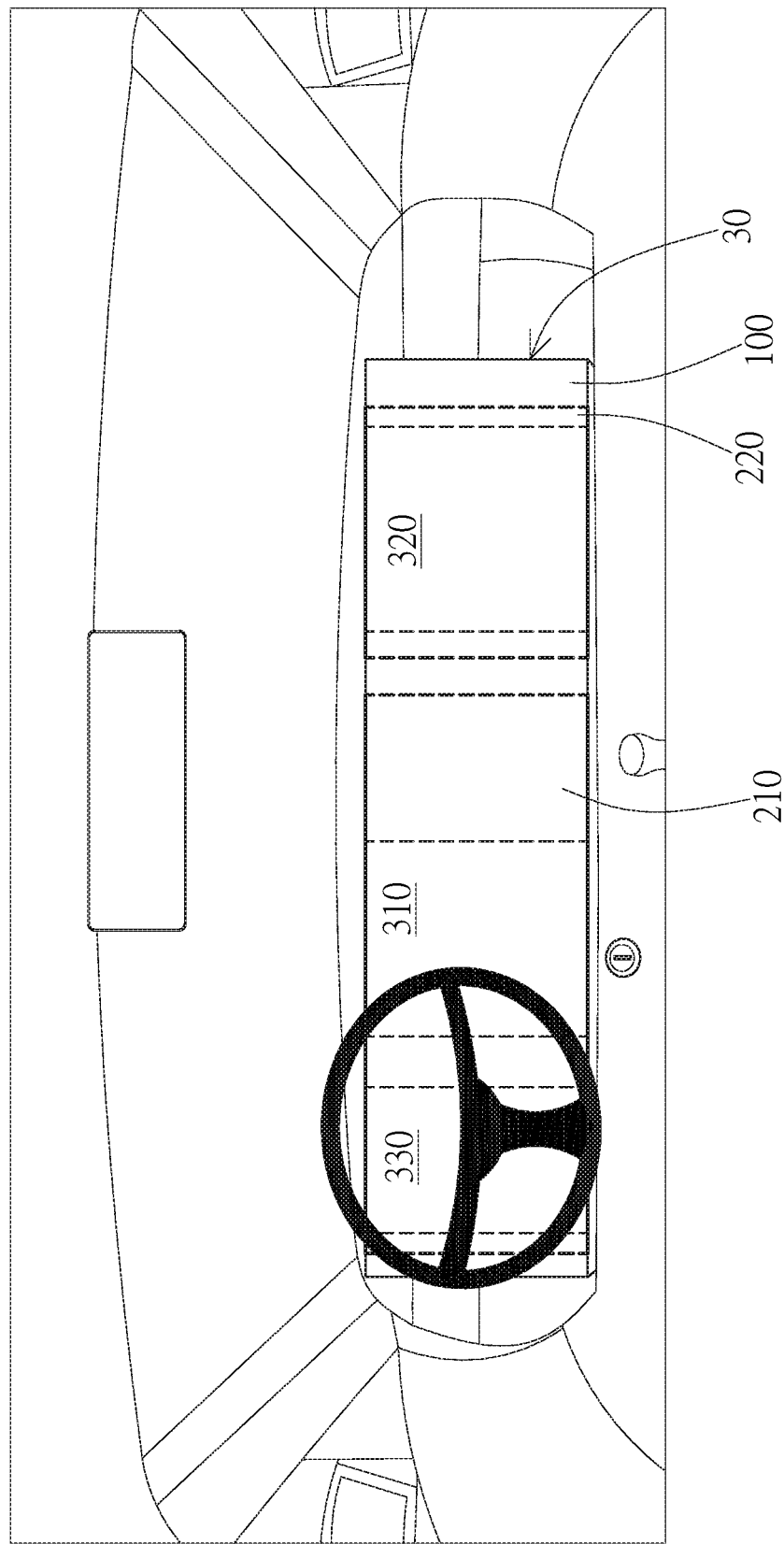
FIG. 6 is a schematic diagram of a display module applied to a traffic vehicle according to still another embodiment of the present invention.

As shown in FIG. 6, according to this embodiment, the display module 30 may be applied to a traffic vehicle 1000 such as an automobile as an instrument panel, and a side of the cover plate 100 opposite to the first separating plate 210 and the second separating plate 220 is a display side. In other words, contents may be sequentially displayed by each display panel such as the first display panel 310, the second display panel 320, and the third display panel 330 through the first separating plate 210 or the second separating plate 220 and the cover plate 100. Referring to both FIG. 6 and FIG. 7, a surface of the cover plate 100 facing away from the first separating plate 210 and the second separating plate 220 may be a display surface 105 expected to face a viewer. The display surface 105 may be divided into a main display surface 115 and a sub-display surface 125 respectively corresponding to the first block 110 and the second block 120. Based on this structure, the display module 30 may be adjusted so that a relative included angle between the main display surface 115 and the sub-display surface 125 can be changed, thereby display angles of the main display surface 115 and the sub-display surface 125 may be adjusted according to situations and viewers. However, it should be noted that the main display surface 115 and the sub-display surface 125 herein are merely different display surfaces whose dispose angles can be changed relative to each other, and each main display surface 115 and each sub-display surface 125 may substantially display images or information to be displayed through one or more display panels.

Figure 7:
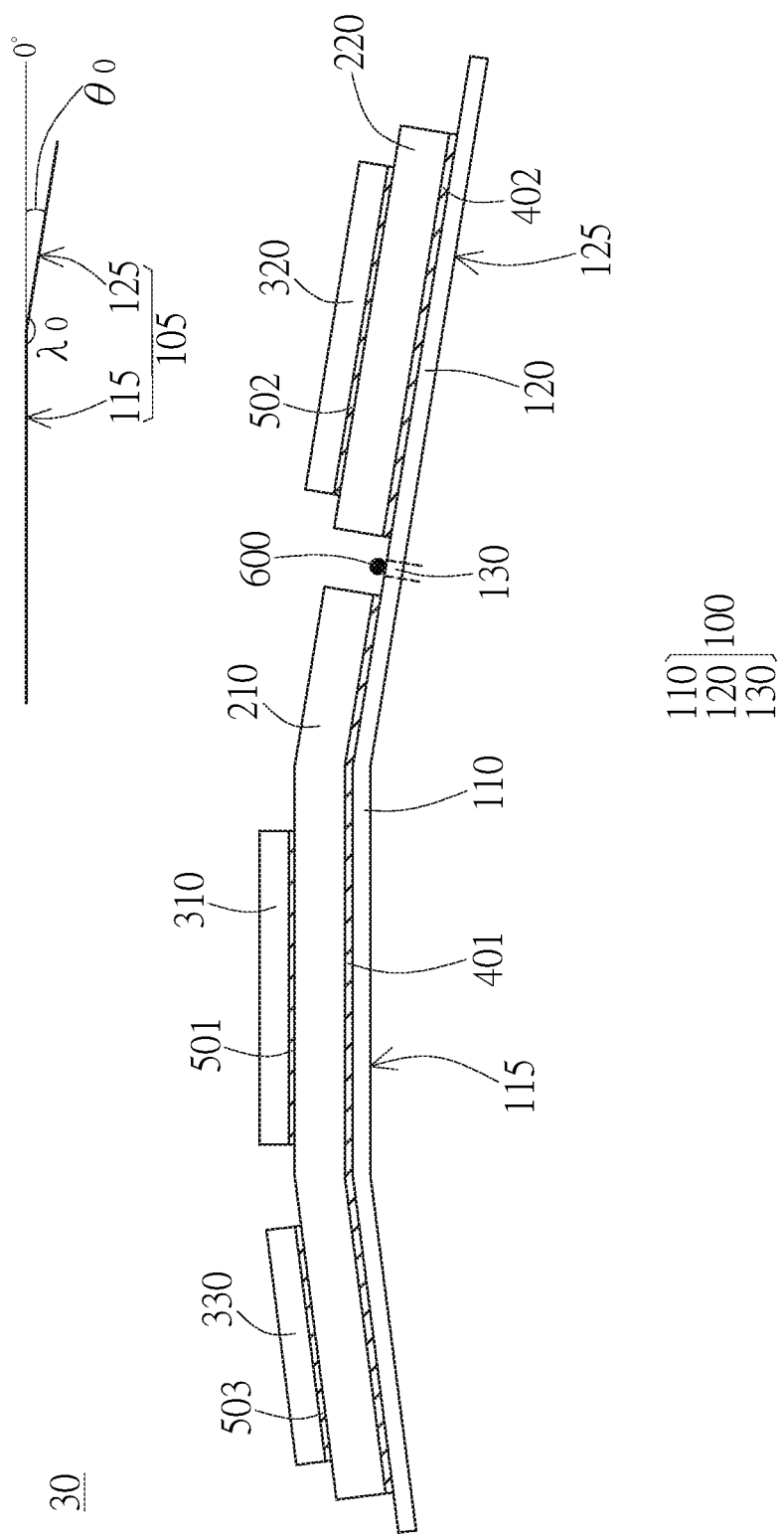
FIG. 7 is a schematic diagram of a display module in a preset status according to still another embodiment of the present invention.

According to some embodiments, as shown in FIG. 7, the display module 30 may further include an actuator 600 configured to rotate the second block 120 based on the connecting section 130. For example, the actuator 600 may include any mechanism or apparatus that can drive to change a dispose angle of the second block 120 relative to the first block 110 based on the connecting section 130, such as a motor, a mechanical bearing, a hinge structure, a hydraulic cylinder, or a pneumatic cylinder, but the present invention is not limited thereto. As described above, based on the driving of the actuator 600, the second block 120 may be rotated relative to the first block 110, which is described below with reference to FIG. 7, FIG. 8, and FIG. 9.

In detail, according to this embodiment, as shown in FIG. 7, an included angle between the main display surface 115 and the sub-display surface 125 presented on the display module 30 is approximately $\lambda_0$, and the sub-display surface 125 may be approximately in a preset state of deviating by an angle $\theta_0$ when an extending direction of the main display surface 115 is defined as approximately 0 degrees. For example, according to an embodiment, the included angle $\lambda_0$ may be 175 degrees, and the angle $\theta_0$ may be −5 degrees. It should be noted that the included angle between the main display surface 115 and the sub-display surface 125 and the extending direction shown in the upper right corner of FIG. 7 is merely a schematic diagram, and the main display surface 115 or the sub-display surface 125 may substantially not be a flat display surface. For example, the main display surface 115 or the sub-display surface 125 may be a curved display surface or a display surface with a plurality of bent sections, and the extending direction of the display surface, the included angle between the main display surface 115 and the sub-display surface 125, or the angle by which the sub-display surface 125 deviates from the extending direction of the main display surface 115 herein is merely schematically shown for ease of description and clear presentation.

Figure 8:
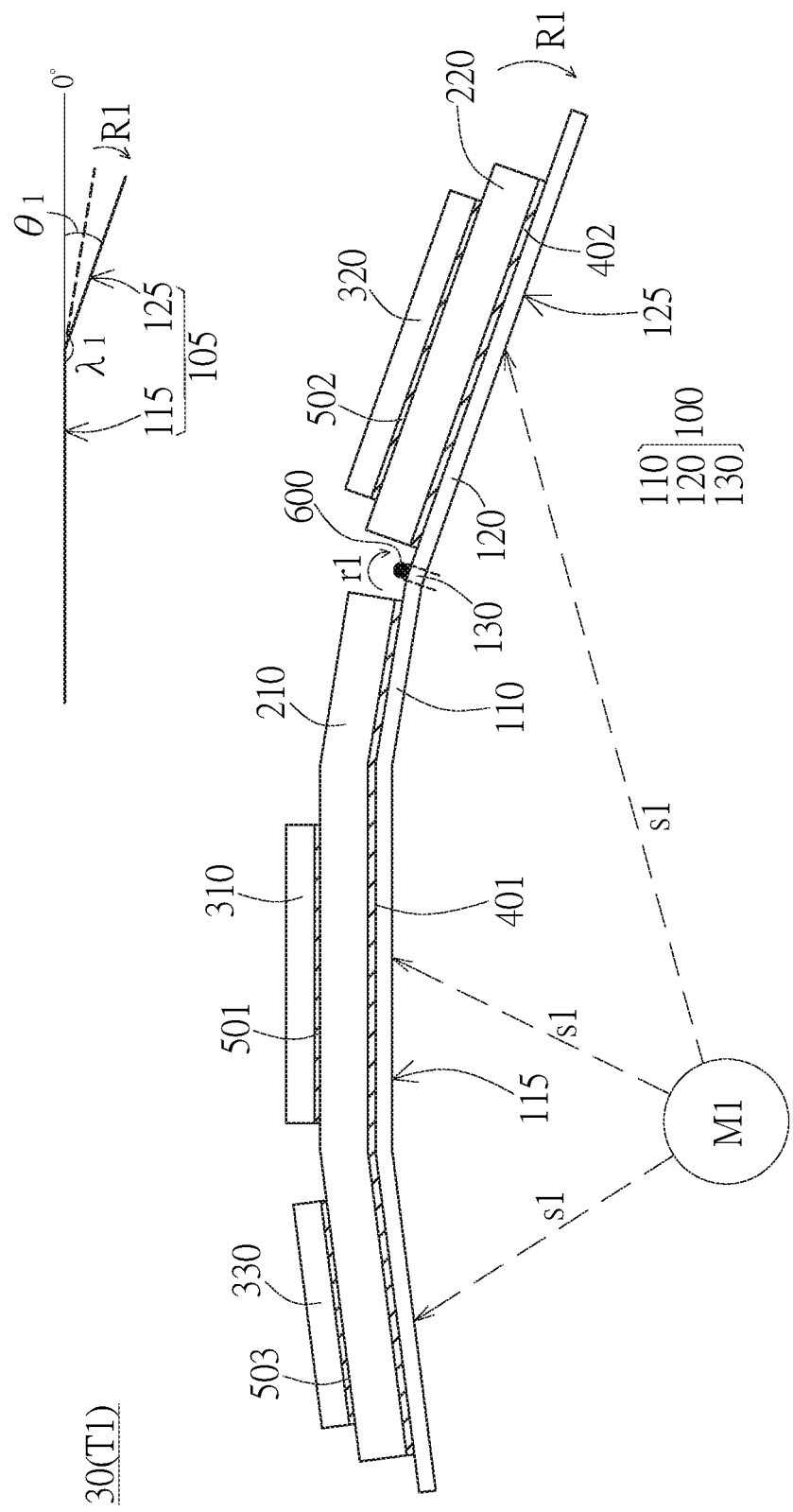
FIG. 8 is a schematic diagram of a first action state of a display module in FIG. 7 according to yet another embodiment of the present invention.

Next, referring to FIG. 8, according to the case in which the display module 30 is applied to a traffic vehicle in this embodiment, when a driver such as a viewer M1 sits closer to the front of the main display surface 115 relative to the sub-display surface 125, in order to help the viewer M1 view the sub-display surface 125, the display module 30 may be switched from the preset state shown in FIG. 7 to an action state T1 shown in FIG. 8. Specifically, in the action state T1, the second block 120 may be rotated in a rotation direction R1 based on the connecting section 130 (for example, under driving of the actuator 600 in the rotation direction r1), so that the included angle $\lambda_1$ between the main display surface 115 and the sub-display surface 125 is smaller. In other words, the sub-display surface 125 may further deviate by an angle $\theta_1$ when an extending direction of the main display surface 115 is defined as approximately 0 degrees. For example, according to an embodiment, the included angle $\lambda_1$ may be 170 degrees, and the angle $\theta_1$ may be −10 degrees. Therefore, sight s1 of the viewer M1 can more easily cover all parts of the display surface 105 (for example, the display surface 105 is disposed to surround the viewer M1 as much as possible), so that information or an image displayed on a display panel such as the first display panel 310, the second display panel 320, and the third display panel 330 can be viewed easier.

Figure 9:
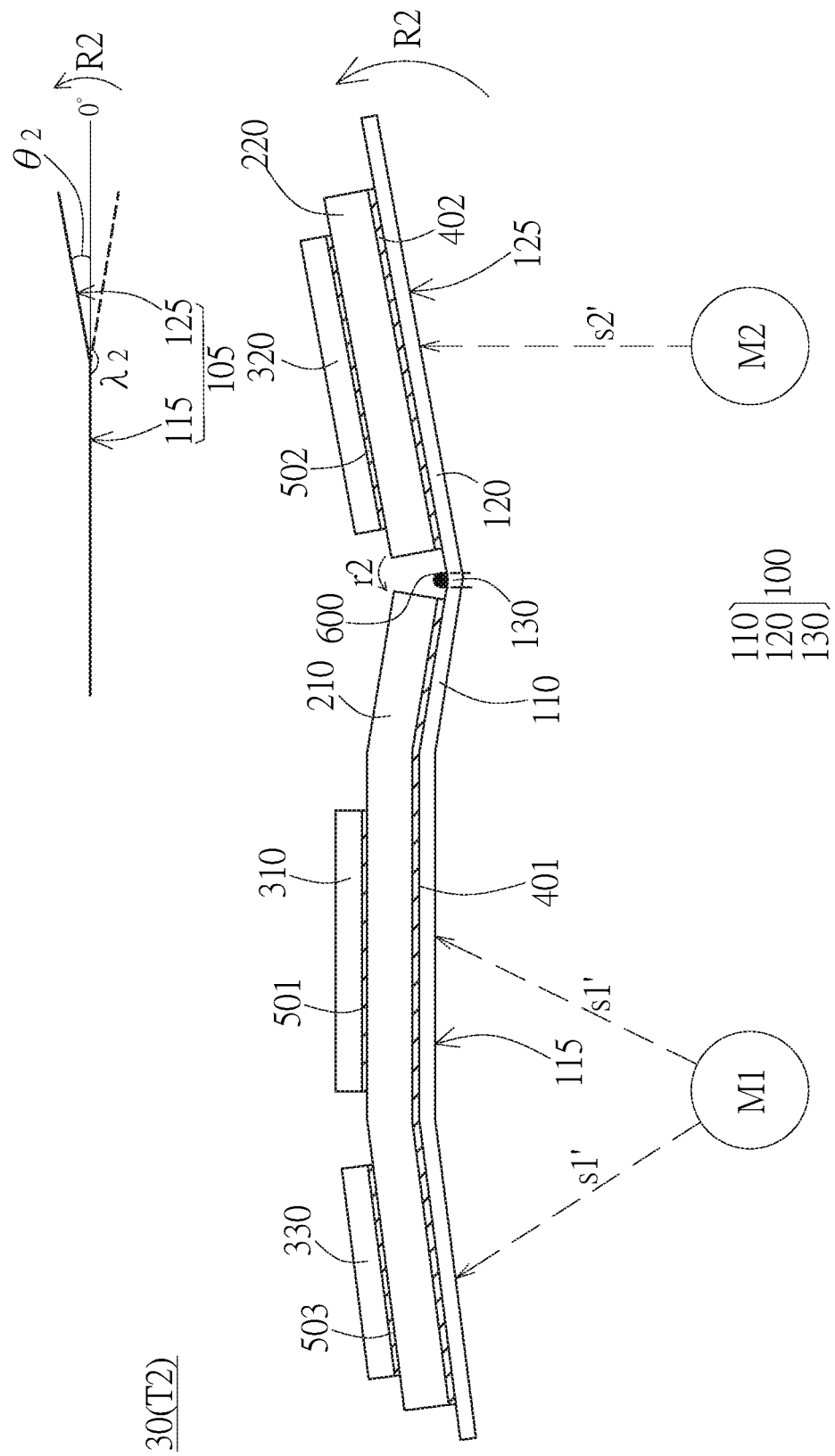
FIG. 9 is a schematic diagram of a second action state of a display module in FIG. 7 according to yet another embodiment of the present invention.

Next, referring to FIG. 9, according to the case in which the display module 30 is applied to a traffic vehicle in this embodiment, when there is another passenger such as a viewer M2 in addition to the driver such as the viewer M1 sits closer to the front of the sub-display surface 125 relative to the main display surface 115, in order to enable both the viewer M1 to view the main display surface 115 and the viewer M2 to view the sub-display surface 125, the display module 30 may be switched from the preset state shown in FIG. 7 to an action state T2 shown in FIG. 9. Specifically, in the action state T2, the second block 120 may be rotated in a rotation direction R2 based on the connecting section 130 (for example, under driving of the actuator 600 in the rotation direction r2), so that the included angle $\lambda_2$ between the main display surface 115 and the sub-display surface 125 is larger. In other words, the sub-display surface 125 may deviate by an angle $\theta_2$ in an opposite direction when an extending direction of the main display surface 115 is defined as approximately 0 degrees. For example, according to an embodiment, the angle $\lambda_2$ between the main display surface 115 and the sub-display surface 125 may be greater than 180 degrees, for example, may be 190 degrees, and the angle $\theta_2$ may be +10 degrees. Therefore, sight s1' of the viewer M1 can cover the display surface 115 and sight s2' of the viewer M2 can cover the sub-display surface 125, so that information or an image displayed on a display panel such as the first display panel 310, the second display panel 320, and the third display panel 330 can be viewed easier.

According to this embodiment, during the switching between the various states, the stress generated from flexure or bending of the cover plate 100 can be absorbed or blocked by the first separating plate 210 and the second separating plate 220 before being transferred into each display panel, so that structural damage or optical property deterioration as a result of the stress can be reduced or avoided. Therefore, display quality such as visibility, contrast, brightness, etc. of the display module 30 relative to the viewer M1 and/or the viewer M2 can be improved.

In addition, in some embodiments, in order to improve or strengthen the display surface 105, elements such as a protective sticker, an explosion-proof film, etc. may be further disposed on the display surface 105, and these aspects are also covered by the scope of the present invention.

Further, the aspect in which the above display module 30 is applied to a traffic vehicle is merely an example, and those of ordinary skill in the art should understand that the display module according to the embodiments of the present invention can be applied to various situations and environments, and the present invention is not limited to the specific application examples herein.

In summary, according to the embodiments of the present invention, the display quality and the reliability of the display module can be further improved under the adjustable display angle of the display surface. Therefore, the display module according to the embodiments of the present invention can be applied to a wider range of situations and environments, thus increasing flexibility and applicability of the display module.

The foregoing descriptions are merely some exemplary embodiments of the present invention. It should be noted that various changes and modifications may be made to the present invention without departing from the spirit and principles of the present invention. A person of ordinary skill in the art should understand that the present invention is subject to the appended claims, and various possible changes such as replacements, combinations, modifications, and conversions in accordance with the intention of the present invention shall fall within the scope of the present invention defined by the appended claims.

LIST OF REFERENCE NUMERALS 10, 20, 30: Display module
100: Cover plate
105: Display surface
110: First block
115: Main display surface
120: Second block
125: Sub-display surface
130: Connecting section
210: First separating plate
220: Second separating plate
310: First display panel
310A: First display region
320: Second display panel
320A: Second display region
330: Third display panel
330A: Third display region
401: Adhesive
402: Adhesive
501: Adhesive
502: Adhesive
503: Adhesive
600: Actuator
1000: Traffic vehicle
d: Gap
L1, L2: Length
t0, t1, t2: Thickness
$\lambda_0, \lambda_1, \lambda_2$: Included angle
$\theta_0, \theta_1, \theta_2$: Angle
M1, M2: Viewer
s1, s1', s2': Sight
T1, T2: Action status
R1, R2: Rotation direction
r1, r2: Rotation direction

What is claimed is:

1. A display module, comprising:
a cover plate, divided into a first block, a second block, and a connecting section between the first block and the second block;
a first separating plate and a second separating plate, disposed on the cover plate respectively corresponding to the first block and the second block and separated from each other; and
a first display panel and a second display panel, respectively disposed on a side of the first separating plate opposite to the cover plate and a side of the second separating plate opposite to the cover plate, wherein the first display panel and the second display panel are separated from each other and perform displaying respectively through the first separating plate and the cover plate, and the second separating plate and the cover plate, wherein rigidity of the first separating plate and rigidity of the second separating plate are respectively greater than rigidity of the cover plate, and the second block is rotatable relative to the first block based on the connecting section.

2. The display module according to claim 1, wherein the first display panel has a first display region, and a shortest cover plate length between the connecting section and the first display region is greater than 10 mm.

3. The display module according to claim 2, wherein the first block is fixedly disposed.

4. The display module according to claim 3, wherein the first display panel has the first display region and the second display panel has a second display region, and the shortest cover plate length between the first display region and the connecting section is greater than a shortest cover plate length between the second display region and the connecting section.

5. The display module according to claim 1, further comprising adhesives disposed between the first separating plate or the second separating plate and the cover plate, between the first display panel and the first separating plate, between the second display panel and the second separating plate, or a combination thereof.

6. The display module according to claim 1, wherein a thickness of the second separating plate is greater than or equal to a thickness of the cover plate.

7. The display module according to claim 1, wherein flexibility of the cover plate is greater than flexibility of the second separating plate.

8. The display module according to claim 1, wherein the second separating plate is made of glass, polycarbonate (PC), or polymethyl methacrylate (PMMA), and the cover plate is made of glass or polyimide (PI).

9. The display module according to claim 1, wherein the connecting section is disposed corresponding to a gap between the first separating plate and the second separating plate.

10. The display module according to claim 9, wherein the gap is greater than 10 mm.

11. The display module according to claim 1, wherein the first display panel has a first display region, and the second display panel has a second display region,
the first separating plate is disposed to at least span and overlap the entire first display region, and the second separating plate is disposed to at least span and overlap the entire second display region.

12. The display module according to claim 11, further comprising a third display panel disposed on a side of the first separating plate opposite to the cover plate, wherein the third display panel has a third display region, and the first separating plate is disposed to at least span and overlap the entire third display region.

* * * * *